United States Patent [19]

Ishigaki et al.

[11] Patent Number: 4,590,443
[45] Date of Patent: May 20, 1986

[54] TRANSISTOR OSCILLATOR WITH COMPENSATING CIRCUIT FOR VARIABLE COLLECTOR-BASE CAPACITANCE

[75] Inventors: Isao Ishigaki, Sagamihara; Mitsuo Makimoto, Yokohama; Sadahiko Yamashita, Sagamihara, all of Japan

[73] Assignee: Matsushita Electric Industrial Co., Ltd., Japan

[21] Appl. No.: 709,717

[22] Filed: Mar. 8, 1985

[30] Foreign Application Priority Data

Mar. 9, 1984 [JP] Japan ................................. 59-45835

[51] Int. Cl.[4] .......................... H03B 5/12; H03L 1/00
[52] U.S. Cl. ................................. 331/117 R; 331/175; 331/177 V
[58] Field of Search ................... 331/117 R, 175, 109, 331/116 R, 177 V

[56] References Cited

U.S. PATENT DOCUMENTS 3,483,437 12/1969 Coyne ..................... 331/117 R X

*Primary Examiner*—Siegfried H. Grimm
*Attorney, Agent, or Firm*—Lowe, Price, Leblanc Becker & Shur

[57] ABSTRACT

A low noise oscillator is disclosed wherein the collector and base of a transistor are respectively biased at different voltages from a common voltage source to be conditioned for generating a high frequency oscillation with a resonant circuit connected to the emitter and collector. The high frequency oscillation developed at the base of the transistor is coupled to ground. A capacitive circuit is coupled between the collector and base of the transistor to eliminate the effect of a voltage-dependent capacitance inherently present in the transistor between its collector and base on the frequency of the oscillation in order to reduce the level of noise introduced to sidebands.

10 Claims, 8 Drawing Figures

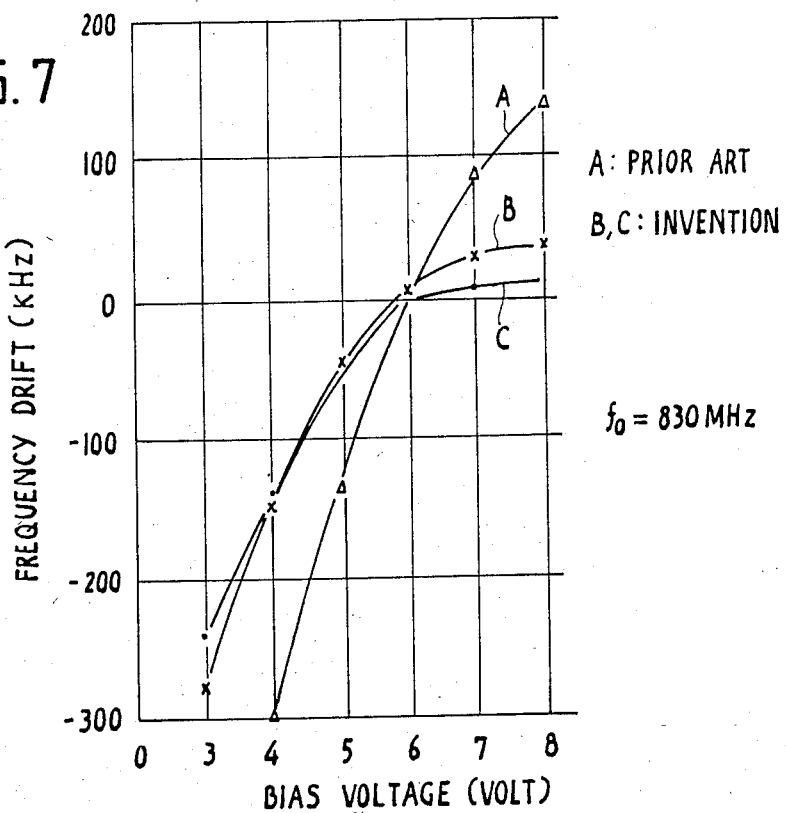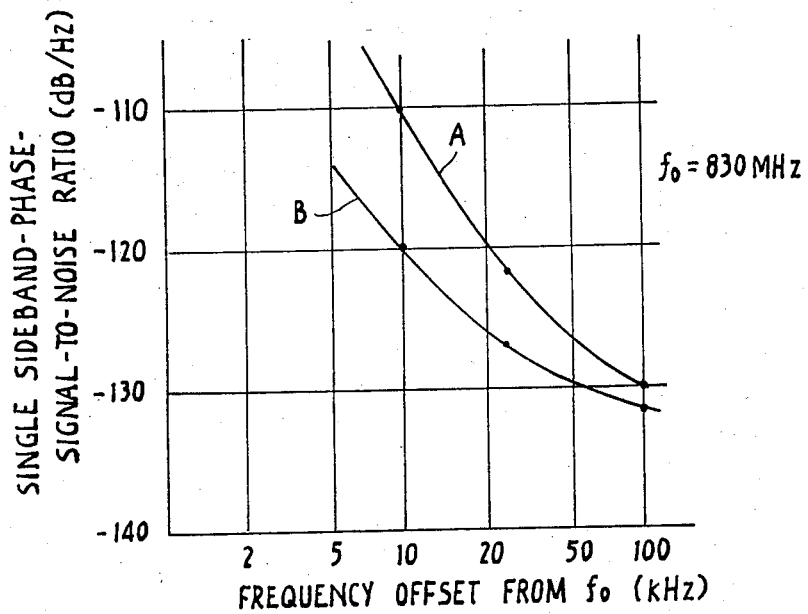

TRANSISTOR OSCILLATOR WITH COMPENSATING CIRCUIT FOR VARIABLE COLLECTOR-BASE CAPACITANCE

BACKGROUND OF THE INVENTION

The present invention relates generally to oscillators in the VHF and UHF bands, and more specifically to a high-stability, low-noise oscillator.

Since the local oscillator of a VHF or UHF transmitter or receiver determines the performance of the apparatus, it is required to operate with a high degree of frequency stability and a low noise level. Silicon bipolar transistors are currently employed as an amplifying element of the oscillator in a base-grounded Colpitts or Hartley configuration. However, prior art oscillators have met with difficulty to meet low noise requirement.

SUMMARY OF THE INVENTION

The present invention is based on the discovery that a voltage-dependent capacitance variation in an oscillator transistor has the effect of modulating the oscillator frequency and increasing the noise level of sideband frequencies.

One of the factors that determine the frequency stability of a transistor oscillator is the "pushing figure" which indicates the amount of change in oscillator frequency produced by a specified change in oscillator source voltage.

Capacitances inherently present in a bipolar transistor between its electrodes (including stray capacitance) vary with changes in source voltage, which in turn causes the transistor voltages and currents to change and hence a change in oscillator frequency. The dominant factor of the frequency variation is the capacitance inherently present in the transistor between the collector and base of the transistor and this capacitance varies as a function of $V^{-\frac{1}{2}}$, where V is the collector voltage. When the transistor is provided in a voltage-controlled oscillator of a phase-locked loop, this voltage-dependent capacitance change modulates the oscillator frequency. It is found that this frequency modulation eventually results in an increase in sideband noise, or carrier-to-noise ratio.

One possible solution is to increase the collector voltage and bias the transistor at such a voltage that minimizes the capacitance change. However, this approach is not practical because delicate tuning and adjustment are required to meet the variety of oscillator circuits having different voltage/current ratings.

According to the present invention, the oscillator comprises a transistor having a base, a collector and an emitter. The collector and base are impressed with appropriate voltages from a voltage source to be conditioned for generating a high frequency oscillation with a resonant circuit connected to the emitter and collector. The high frequency oscillation developed at the base of the transistor is coupled to ground. A capacitive circuit is coupled between the collector and base of the transistor to eliminate the effect of a voltage-dependent capacitance inherently present in the transistor between its collector and base on the frequency of the oscillation to minimize the level of noise in sidebands.

BRIEF DESCRIPTION OF THE DRAWINGS

The present invention will be described in further detail with reference to the accompanying drawings, in which:

FIG. 7 is a graphic illustration of frequency drifts for comparison between the prior art and the invention; and FIG. 8 is a graphic illustration of single sideband-phase-noise-to-signal ratios for comparison between the prior art and the invention.

DETAILED DESCRIPTION

Figure 1:
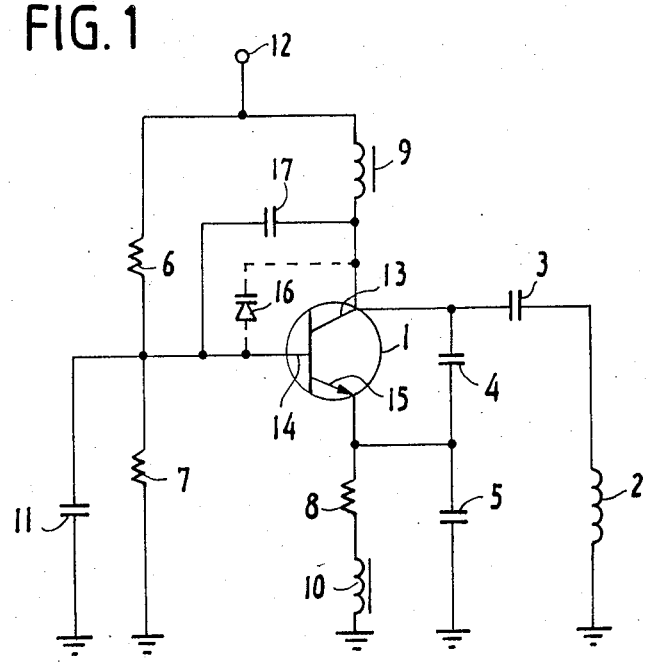
FIG. 1 is a circuit diagram of a first embodiment of the present invention.

The circuit shown in FIG. 1 is a Colpitts oscillator of a base-grounded type according to the present invention. The collector 13 of a silicon bipolar transistor 1 is impressed with a voltage supplied from a terminal 12 through a high-frequency choke 9 and the emitter 15 is connected to ground through a bias determination resistor 8 and a high-frequency choke 10. The collector 13 is connected to ground through a first series circuit including a DC decoupling capacitor 3 and an inductive element 2 and through a second series circuit including feedback capacitors 4 and 5, the junction therebetween being coupled to the emitter. Inductive element 2 and feedback capacitors 4, 5 constitute a resonant circuit. The base 14 of transistor 1 is biased at a voltage developed at a junction between bias determination resistors 6 and 7 connected in series from terminal 12 to ground. The base 14 is further coupled to ground by a DC decoupling capacitor 11 to pass high frequency current to ground.

The transistor 1 has a voltage-dependent, capacitance which exits internally between the collector and base and a stray capacitance which exists externally between these electrodes. These capacitances are represented by a varactor 16 having a capacitance value $C_1$.

A capacitor 17 having a fixed value of capacitance $C_2$ is connected across the collector and base of transistor 1 to minimize the undesirable effect of the variable capacitance characteristic of bipolar transistor 1. The capacitance value $C_2$ is greater than the capacitance value $C_1$, preferably with a ratio of 6 to 1.

With $C_2$ being in shunt with $C_1$, a source voltage variation at terminal 12 causes capacitance $C_1$ to change by an amount $\Delta C_1$. The ratio of the capacitance variation to the maximum total capacitance value is given by $\Delta C_1/(C_1+C_2)$. Since this ratio is smaller than the ratio $\Delta C_1/C_1$ of conventional oscillators, the oscillator of the invention is less affected by source voltage variations so that it can operate with a high degree of frequency stability and low noise level.

Figure 2:
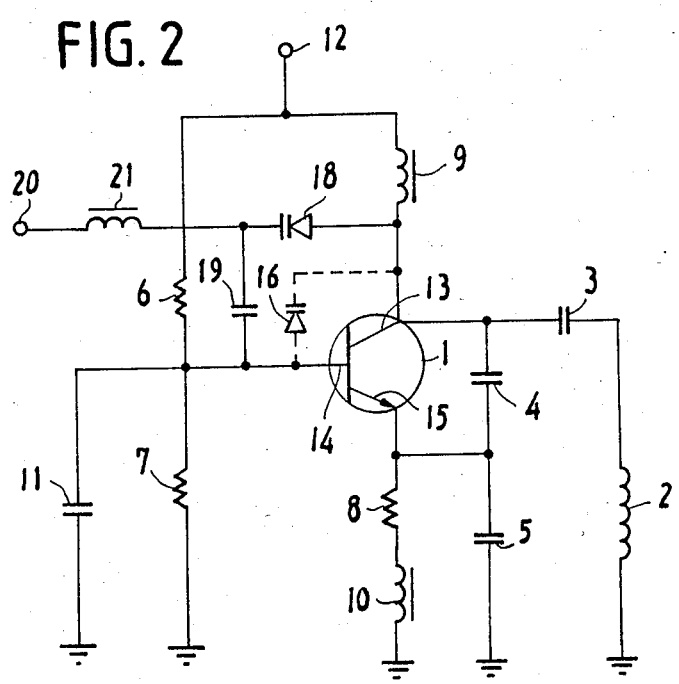
FIG. 2 is a circuit diagram of a second embodiment of the invention.

An oscillator circuit shown in FIG. 2 is a modified embodiment of the invention which differs from the FIG. 1 embodiment in that it replaces the capacitor 17 with a series circuit including a varactor 18 and a capacitor 19. The junction between varactor 18 and capacitor 19 is connected by a high frequency choke 21 to a voltage source terminal 20. The varactor 18 is connected so that its anode is coupled to the collector 13 and its cathode is coupled by capacitor 19 to the base 14. The varactor 18 is driven at the cathode to a potential higher than the potential at the anode and hence the collector potential.

Figure 3:
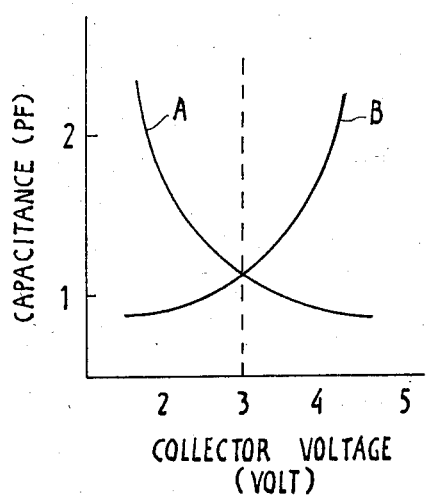
FIG. 3 is a graphic illustration of the capacitance variation characteristics of a varactor and the equivalent varactor of the transistor of FIG. 2.

The capacitance of varactor 18 follows a curve B, FIG. 3, which increases nonlinearly with collector voltage V as given by the relation $kV^{\frac{1}{2}}$ (where k is a constant), while the capacitance of equivalent varactor 16 follows a nonlinearly decreasing curve A given by the relation $kV^{-\frac{1}{2}}$. Therefore, a voltage rise at the collector 13 will cause a capacitance drop in equivalent varactor 16. This causes a voltage drop across varactor 18 and hence a capacitance rise therein by an amount equal to the amount of capacitance change in equivalent varactor 16. As a result, the undesirable capacitance variation is canceled by the capacitance variation of the additional varactor 18.

In a practical aspect, the characteristic curve B is implemented by a varactor 18 having the same ratio of capacitance variations as the ratio of capacitance variations of equivalent varactor 16. In that instance, capacitor 19 has a value that is sufficient to provide a low-impedance path for high frequency current. Alternatively, varactor 18 and capacitor 19 are so selected that the ratio of voltage-dependent capacitance variations of their combined capacitance value approximates the ratio of capacitance variations of equivalent varactor 16.

Figure 4:
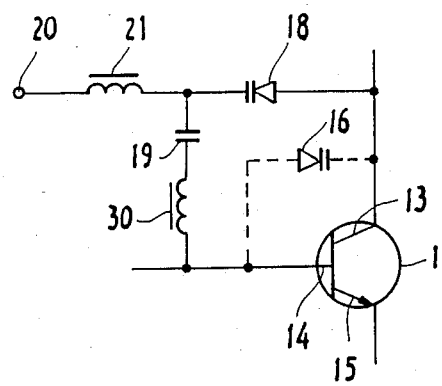
FIG. 4 is a circuit diagram of a modified embodiment of FIG. 2.

To minimize high frequency leak through varactor 18 and capacitor 19, it is preferable that a high frequency choke 30 be connected in the capacitance-varactor series circuit as shown in FIG. 4. Obviously, the high frequency choke 30 may also be connected in series with capacitor 17 of FIG. 1.

Figure 5:
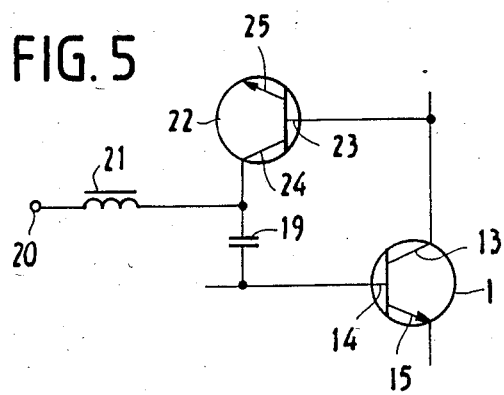
FIGS. 5 and 6 are circuit diagrams of alternative embodiments of FIG. 2.

In an alternative embodiment, the varactor 18 of FIGS. 2 and 4 may be replaced with a bipolar transistor 22 having the same conductivity type and same operating characteristics as the oscillator transistor 1 and connected in a manner as shown in FIG. 5. The base 23 of transistor 22 is connected to the collector 13 of transistor 1 and the collector 24 is connected to capacitor 19 at a point to which the bias terminal 20 is connected through high frequency choke 21. The emitter 25 of transistor 22 is not utilized. The bias voltage at terminal 20 drives the collector 24 to such a potential that the voltage between it and the base 23 is equal to the voltage across the collector 13 and base 14 of transistor 1. Due to the identical operating characteristics, capacitance changes in the two transistors are equal in amount but opposite in direction.

Figure 6:
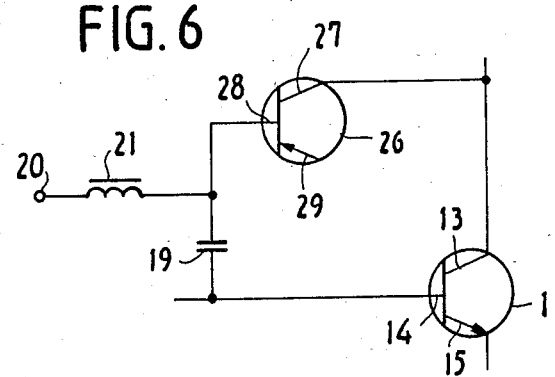

Alternatively, a bipolar transistor 26 having a conductivity type opposite to the conductivity type of oscillator transistor 1 and an operating characteristic identical thereto, may be employed instead of transistor 22 in a manner shown in FIG. 6. The collector 27 is connected to the collector 13 of transistor 1 and the base 28 is connected to capacitor 19, with the emitter 29 being not utilized as in FIG. 5. The bias voltage at terminal 20 drives the base 28 to such a potential that the voltage between it and the collector 27 is equal to the voltage across the collector 13 and base 14 of transistor 1.

Experiments were conducted to illustrate the frequency-drift and noise reduction characteristics of the invention in comparison with the prior art oscillator.

FIG. 7 is an illustration of oscillator frequency drift in kiloherz plotted as a function of bias voltage at terminal 12 with the oscillator operating at a frequency fo=830 MHz when the bias voltage is 6 volts. The bias voltage was varied in the range from 3 volts to 8 volts. The prior art oscillator exhibited a frequency drift shown at curve A, while the oscillator of FIG. 1 exhibited a drift shown at curve B. The frequency drifts exhibited by the oscillators of FIGS. 2, 4–6 showed a significant reduction for upward voltage drifts as shown at curve C. It is noted that the frequency drift is suppressed to a value smaller than one-half of the prior art.

Curve A in FIG. 8 shows a plot of noise in the prior art oscillator represented by single sideband-phase-noise-to-signal ratio as a function of frequency offset from the oscillator frequency at 830 MHz, and curve B is the single sideband-phase-noise-to-signal ratio of the present invention. It is noted that the frequency modulation noise of the oscillator having the varactor-capacitor combination is suppressed to a level which is lower by at least 2 dB than the noise level of the prior art.

While mention has been made of Colpitts oscillators, the present invention could equally be as well applied to oscillators of the base-grounded type including Hartley oscillators. The frequency-drift and noise reduction circuit of the invention could be modified without departing from the scope of the present invention which is only limited by the appended claims. Therefore, the embodiments shown and described are only illustrative, not restrictive.

What is claimed is:

1. An oscillator comprising:
  a transistor having a base, a collector and an emitter;
  means for supplying a first voltage to said collector from a voltage source;
  means for supplying a second voltage to said base from said voltage source;
  a resonant circuit connected to said emitter and collector for generating a high frequency oscillation in said transistor;
  means for coupling the high frequency oscillation developed at said base to ground; and
  a capacitive circuit externally coupled between said collector and base for eliminating the effect of a voltage-dependent variable capacitance inherently present in said transistor between said collector and base on the frequency of said oscillation.

2. An oscillator as claimed in claim 1, wherein said capacitive circuit has a fixed value of capacitance.

3. An oscillator as claimed in claim 2, wherein said capacitance of fixed value is greater than the capacitance inherently present in said transistor.

4. An oscillator as claimed in claim 1, wherein said capacitive circuit has a voltage-dependent capacitance.

5. An oscillator as claimed in claim 4, wherein said capacitive circuit comprises a combination of a capacitor and a varactor and means for supplying a bias voltage to said varactor.

6. An oscillator as claimed in claim 1, further comprising:
  a second transistor having an identical operating characteristic to the operating characteristic of the first-mentioned transistor, said second transistor having a base and a collector, said capacitive circuit comprising a capacitor and the base and collector of the second transistor in circuit with the capacitor, and means for biasing said second transistor.

7. An oscillator as claimed in claim 6, wherein said second transistor is of the same conductivity type as the conductivity type of said first transistor.

8. An oscillator as claimed in claim 6, wherein said second transistor is of the opposite conductivity type to the conductivity type of said first transistor.

9. An oscillator as claimed in claim 1, wherein said capacitive circuit includes means for rejecting said high frequency oscillation.

10. An oscillator as claimed in claim 1, wherein said transistor is connected in a Colpitts circuit configuration.

* * * * *